United States Patent [19]

Gilder, Jr. et al.

[11] Patent Number: 4,653,174
[45] Date of Patent: Mar. 31, 1987

[54] METHOD OF MAKING PACKAGED IC CHIP

[75] Inventors: Thomas G. Gilder, Jr., York; Raymond D. O'Dean, Dover, both of Pa.

[73] Assignee: GTE Products Corporation, Stamford, Conn.

[21] Appl. No.: 823,132

[22] Filed: Jan. 27, 1986

Related U.S. Application Data

[63] Continuation of Ser. No. 783,798, Oct. 3, 1985, abandoned, which is a continuation of Ser. No. 606,311, May 2, 1984, abandoned, and a continuation of Ser. No. 783,326, Oct. 3, 1985, abandoned, which is a continuation of Ser. No. 606,312, May 2, 1984, abandoned, and a continuation of Ser. No. 783,068, Oct. 10, 1985, abandoned, which is a continuation of Ser. No. 606,310, May 2, 1984, abandoned.

[51] Int. Cl.⁴ .......................................... H01L 21/66
[52] U.S. Cl. ...................... 29/574; 29/588; 29/589; 29/591; 29/827
[58] Field of Search ................ 29/827, 837, 844, 848, 29/856, 576 S, 588, 589, 591, 590, 574; 357/70, 80; 174/52 FP

[56] References Cited

U.S. PATENT DOCUMENTS

| | | | |
|---|---|---|---|
| 3,484,533 | 12/1969 | Kauffman | 29/576 S X |
| 3,529,073 | 9/1970 | Leonard | 29/589 X |
| 3,802,069 | 4/1974 | Thompson | 29/588 X |
| 3,882,597 | 5/1975 | Chayka et al. | 29/827 |
| 3,906,621 | 9/1975 | Epple | 29/591 |
| 4,012,766 | 3/1977 | Phillips et al. | 29/591 X |
| 4,142,287 | 3/1979 | Grabbe | 29/628 |
| 4,413,404 | 11/1983 | Burns | 29/576 S X |

Primary Examiner—Brian E. Hearn
Assistant Examiner—Beverly A. Pawlikowski
Attorney, Agent, or Firm—William H. McNeill; James Theodosopoulos

[57] ABSTRACT

In the manufacture of a packaged IC chip, a lead frame segment has a plurality of leads, the ends of which are connected to opposing rails. After the leads are secured to a lead frame support, the rails are removed and an IC chip is then connected. The chip and lead frame are then encapsulated between the support and a cover.

2 Claims, 7 Drawing Figures

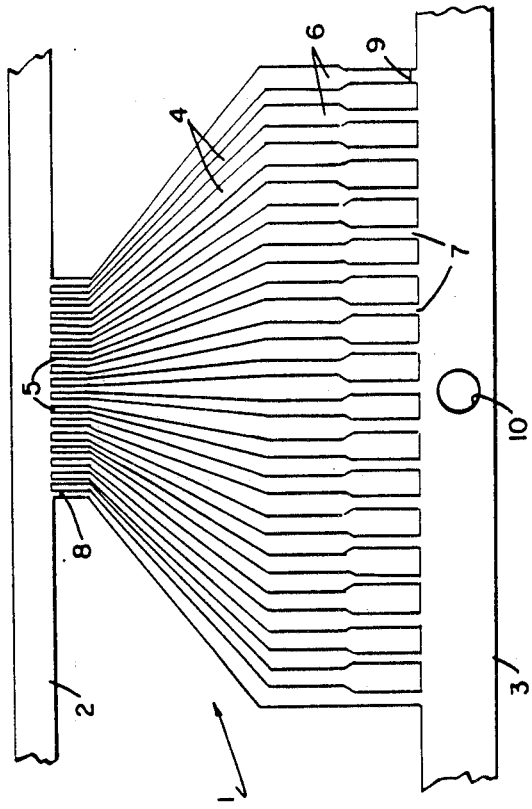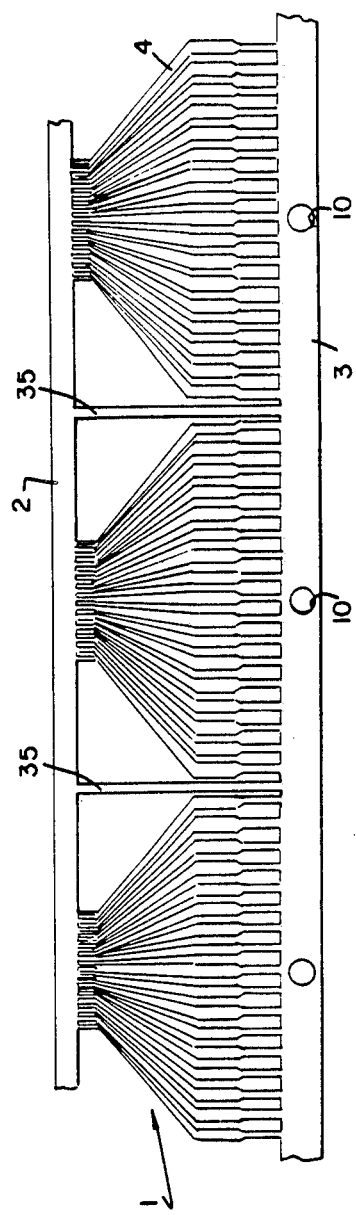

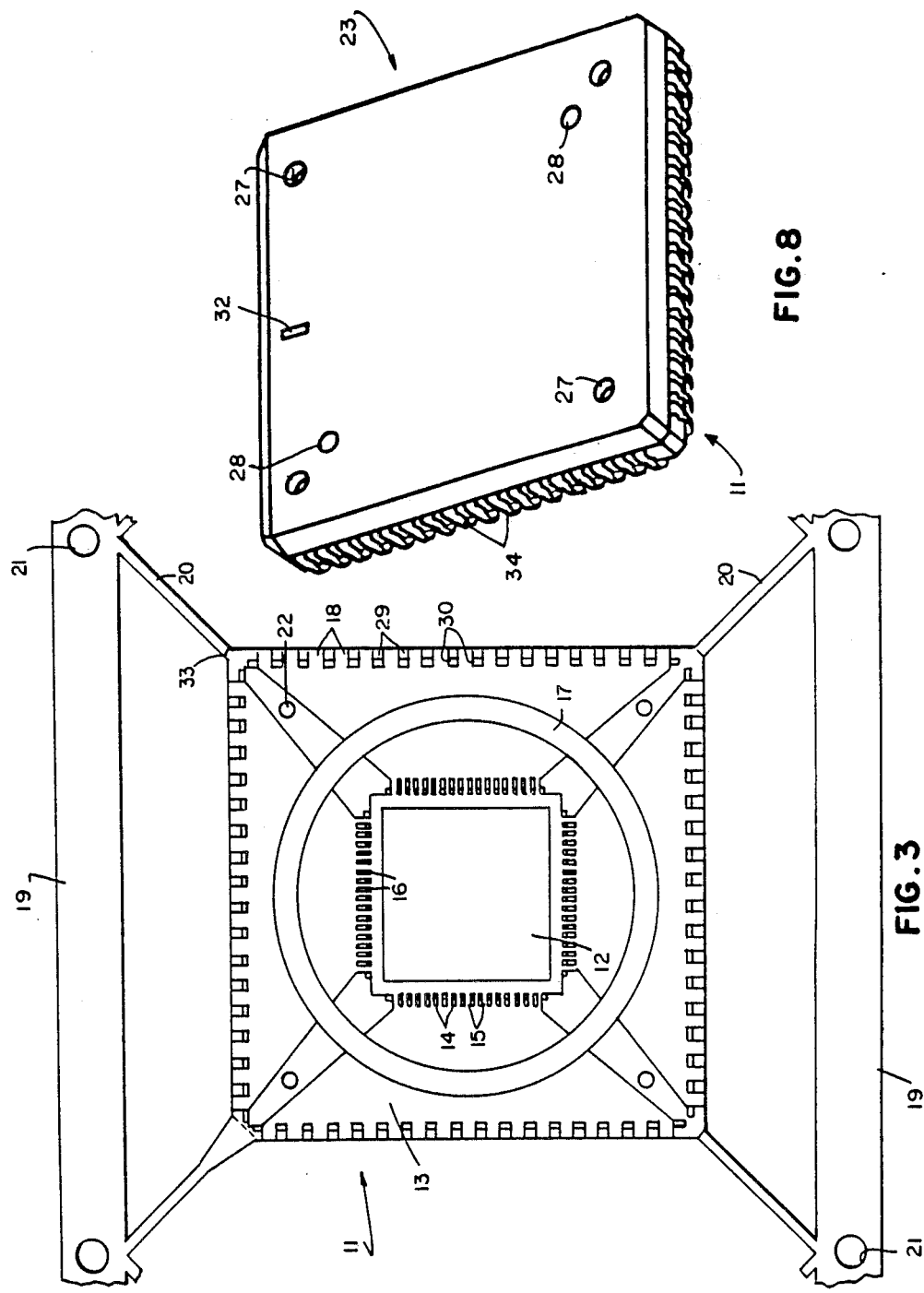

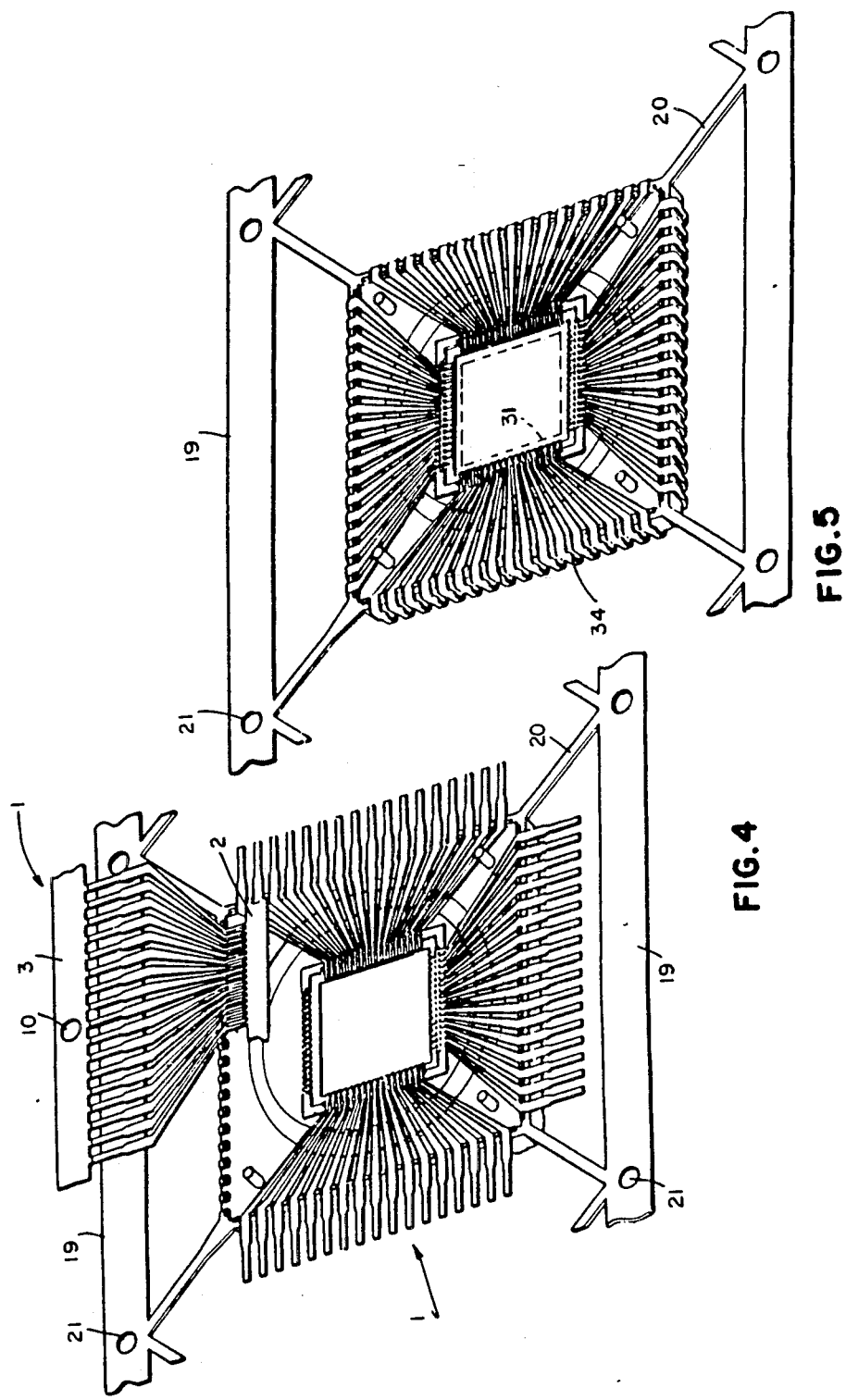

METHOD OF MAKING PACKAGED IC CHIP

This application is a continuation of the following applications: Ser. No. 783,798, filed Oct. 3, 1985, now abandoned, which is a continuation of Ser. No. 606,311, filed May 2, 1984, now abandoned; Ser. No. 783,326, filed Oct. 3, 1985, now abandoned which is a continuation of Ser. No. 606,312, filed May 2, 1984, now abandoned; and Ser. No. 783,068, filed Oct. 10, 1985, now abandoned which is a continuation of Ser. No. 606,310, filed May 2, 1984, now abandoned. All of the above applications are assigned to the assignee of the instant invention and are by the same inventors.

This invention concerns lead frames for use with integrated circuit chips. The manufacture of such lead frames is disclosed in, for example, the following U.S. Pat. Nos.: 4,204,317; 4,137,546; 3,750,277; 3,537,175; 3,469,953. After an IC chip has been mounted on a lead frame chip carrier, and electrically connected to the leads thereof, it is often packaged in encapsulating material. Such packaged chip-containing lead frames are shown in, for example, the following U.S. Pat. Nos.: 4,331,831; 4,301,464; 4,298,883; 4,264,917; 4,214,364; 4,132,856; 4,124,864; 4,079,511; 3,978,516; 3,793,474; 3,684,464; 3,659,821; 3,611,061; 3,436,810.

As pointed out in the above patents, the lead frames are usually made by stamping or etching metal strips. Where the manufactured quantities are sufficiently great, stamping is preferred because of its lower cost.

As the circuits on the chips become more complex, a greater number of leads per lead frame is required. This complicates the stamping operation. Stamping is carried out in progressive dies; that is, a metal strip is fed through a stamping press having successive punch and die sets at a number of stations, where successive stamping operations are carried out. For example, a lead frame having 68 leads would require about 15 to 20 stamping stations and about 140 to 150 cuts. As the number of required stamping stations and cuts increases, the difficulty in maintaining adequate quality of the stamped lead frames also increases.

This invention can reduce the number of required stamping stations and cuts per lead frame. This is accomplished by not making an entire lead frame out of one integral metal strip, as was done in the prior art. Instead, the lead frame is fabricated from a plurality of individual segments which can be fabricated from the same set of stamping tools. Thus, if two segments are used per lead frame, the number of stamping stations can be about halved and the number of cuts can be reduced even more. And if four segments are used per lead frame, the number of stamping stations and cuts can be reduced an even greater extent. The lead frame is manufactured by assembling the segments with precise positioning, and then securing the segments in a suitable support to maintain said precise positions. An IC chip can then be disposed thereon and electrically connected to the leads.

This invention is particularly concerned with the manufacture of a packaged IC chip where the leads of each lead frame segment are connected at their ends to opposing rails until the leads are co-planarly secured to the support, after which the rails are removed.

The invention is also concerned with the making of the lead frame support and securing of the lead frame segment thereto. The support has raised spaced apart projections, the spaces between projections being slots in which the leads of the segments are secured.

The invention is further concerned with the manufacture of an encapsulated IC chip which permits electrical testing thereof prior to encapsulation. Thus, in many cases, faults, such as poor electrical connections, can be repaired prior to encapsulation.

In the drawing,

FIG. 1 shows a lead frame segment after stamping and

FIG. 2 shows a strip of such lead frame segments.

FIG. 3 is a plan end view of a support for a lead frame.

FIG. 4 shows the support with three lead frame segments attached and the fourth ready for attachment.

FIG. 5 shows the support with all lead frame segments attached and the leads formed.

FIG. 8 shows the finished chip-containing lead frame package.

Figure 6:
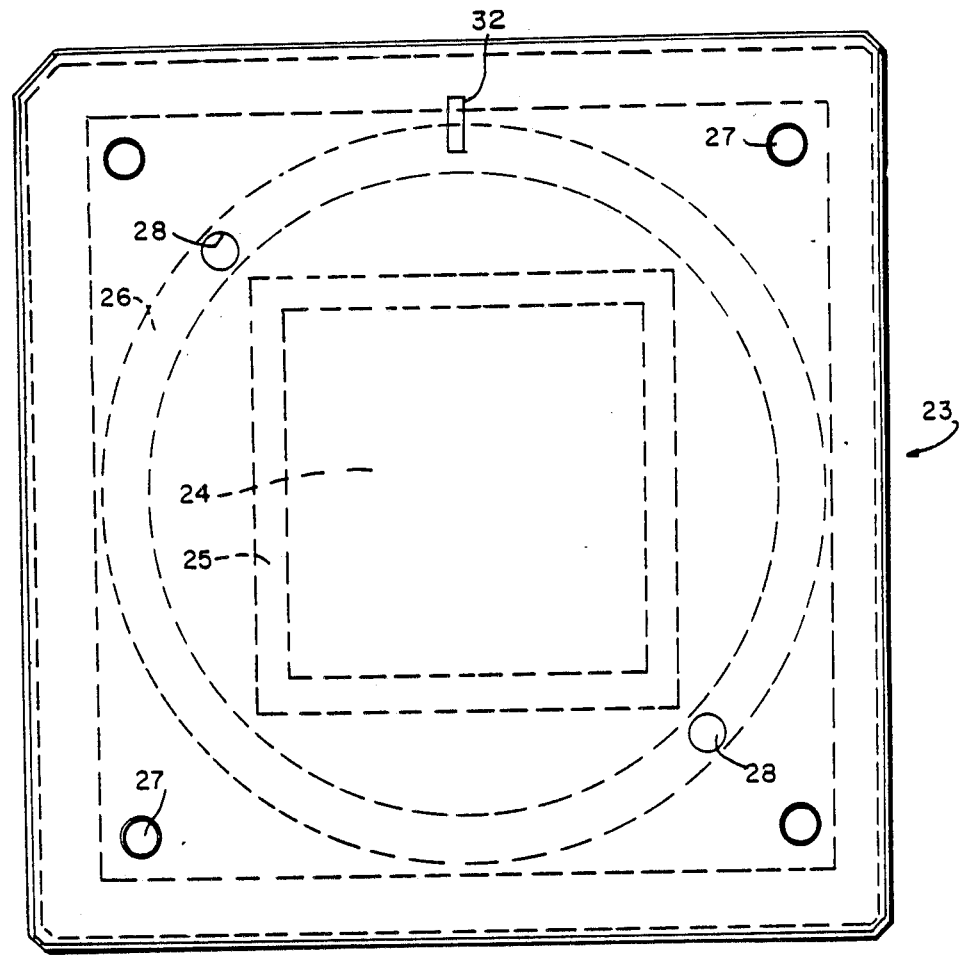
FIGS. 6 and 7 are plan and end views of a cover for the support.

In one embodiment, substantially identical lead frame segments 1 were stamped from a long metal strip, as shown in FIG. 2. One such segment 1 is shown in FIG. 1. In one example, segments 1 were stamped from 10 mil copper alloy, specifically, Olin CDA194, and were maintained in strip form by means of continuous rails 2 and 3, as shown in FIG. 2. Between segments 1, there were support bars 35 extending from rail 3 to rail 2. Each segment 1 comprised seventeen leads 4. The inner ends 5 of leads 4, which would eventually be electrically connected to an IC chip, were 9 mils wide and spaced 9 mils apart. The widest parts 6 of leads 4 were inward from the outer ends 7 thereof and were 28 mils wide spaced 22 mils apart. Outer ends 7 were 18 mils wide spaced 32 mils apart. There were score lines 8 and 9 on leads 4 about 5 mils from rails 2 and 3. Rails 2 and 3 would eventually be broken off at score lines 8 and 9. There were 62 mil diameter holes 10 in rail 3, which provided means for precise positioning of the lead frame segments during indexing of the copper strip during processing. Rails 2 and 3 were 63 and 100 mils wide, respectively. The distance between score lines 8 and 9 was 480 mils.

Support 11 for this example, shown in FIG. 3, was made of a high temperature thermoplastic material, specifically, a polyetherimide resin made by General Electric Co., Pittsfield, Mass., under the trade name Ultem. In the center of support 11 was a recess 12 in which an IC chip would eventually be disposed. Recess 12 was 340 mils square and was recessed 8 mils below surface 13 of support 11. Surrounding recess 12 were seventy-two raised projections 14, eighteen per side. Projections 14 were 7 mils wide by 25 mils long by 9 mils high. Spaces 15 between the projections were 11 mils wide. At assembly of segments 1 to support 11, narrow ends 5 of leads 4 would lie on surface 13 in spaces 15 between projections 14. This provides means for accurate co-planar positioning of ends 5 in support 11. On the inner end of each projection 14 was another raised portion 16, measuring 7 mils wide by 10 mils long by 6 mils high. Raised portions 16 provided means for securing the leads in spaces 15 by, for example heating and slightly flowing plastic portions 16 over the leads. There was an encircling trough 17 outside the perimeter formed by all the projections 14.

At the periphery of support 11 there were sixty-eight slots 18 in which parts 6 of leads 4 would fit. Slots 18 were formed by projections 29 which were similar to projections 14 but bigger. Projections 29 were 20 mils wide by 32 mils long by 9 mils high. Slots 18 were 30 mils wide. There were raised portions 30 on the inner ends of projections 29, similar to raised portions 16 on projections 14. Raised portions 30 were 20 mils wide by 10 mils long by 6 mils high.

In order to permit supports 11 to be processed in existing manufacturing equipment for chip-carrying lead frames, there were rails 19, compatible with said equipment, spaced from each side of support 11 and connected thereto by tie bars 20. Rails 19 were 10 mils thick by 135 mils wide and were 1.400 inches apart from each other. Holes 21 provided means for accurate positioning of the supports during indexing. There were four posts 22 on support 11 for accurate mating of support 11 with cover 23, which was made of the same plastic as support 11.

Cover 23 had a recess 24 to mate with recess 12, and had an additional recess 25 to accommodate projections 14. Cover 23 also had a trough 26 to mate with trough 17, and four holes 27 into which posts 22 fit. There were also two holes 28 connecting with trough 26. After assembly of cover 23 onto support 11, a sealant material could be injected into holes 28 to fill troughs 17 and 26 in order to seal the IC chip from the environment.

Assembly of the components would proceed as follows. Four lead frame segments 1, with rails 2 and 3 still attached, would be placed on top of support 11, one at a time and one in each quadrant, as shown in FIG. 5. Each segment 1, with rails 2 and 3 still attached thereto but with rail 2 having been trimmed sufficiently to fit the space, as shown in FIG. 4, would be carefully positioned so that ends 5 lay in spaces 15 and parts 6 lay in slots 18. Pressure would then be applied to segment 1 to ensure that it was flush against surface 13 and then, maintaining the pressure, heat would be applied to portions 16 and 30 to cause them to flow over, and secure in place, ends 5 and parts 6 of leads 4. Rails 2 and 3 would then be broken off at score lines 8 and 9. This process would be repeated for each lead frame segment 1. This construction ensures accurate positioning, with secure attachment, of all sixty-eight leads with excellent co-planarity thereof.

Next, an IC chip 31, shown in dotted lines in FIG. 5, would be conventionally attached in the pad area, recess 12, and would be conventionally electrically connected to ends 5 of leads 4. The rail construction of support 11 permits this processing to be performed on existing chip-carrier lead frame processing equipment. An advantage of this invention is that the IC chip and package can now be tested for electrical characteristics, because all sixty-eight leads are now electrically isolated, and repair of electrical connections can be made, if necessary. In the past, such repair could not be made because the leads were not electrically isolated until after packaging. The external ends of leads 4 can now be formed into a desired shape, such as "J" lead shape 34 shown in FIGS. 5 and 8.

Figure 7:
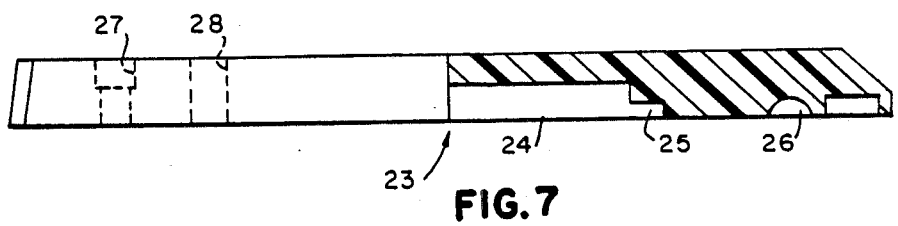

Next, cover 23 is placed on support 11, posts 22 fitting into holes 27. Holes 27 are counterbored about half-way through as shown in FIG. 7, for example, to 43 mils diameter from 33 mils diameter. Posts 27 extend somewhat in the counterbores of holes 27, thereby providing the means for securing cover 23 to support 11 by heat-flowing the extending upper ends of posts 27, as raised portions 16 and 30 were heat-flowed. Next, a sealant, for example, a silicone gel, is pumped into holes 28 to completely fill troughs 17 and 28 as well as holes 28. The sealant should be sufficiently adherent and flexible, after curing, to maintain a hermetic seal through normal thermal cycling requirements. If desired, assembly of cover 23 and sealing of trough 17 and 28 can be performed in an atmosphere having greater heat dissipation characteristics than air such as helium. This atmosphere will be sealed in the recesses in which chip 31 is disposed. To complete the package, a lead identifier 32 may be used, as shown in FIG. 8, and rails 19 and tie bars 20 are removed at score lines 33.

The finished unit, shown in FIG. 8, had overall measurements, including formed leads 34, of 988 mils square by 175 mils high.

This invention is also applicable to lead frames made other than by stamping, such as etching or chemical forming. There, a significant advantage to the use of segments as per this invention is a substantial reduction in tooling cost.

We claim:

1. The method of making a packaged IC chip comprising the steps of:
    (a) preparing a longitudinal strip containing a plurality of substantially identical lead frame segments, each lead frame segment having a multiplicity of leads connected to opposing continuous rails, said leads having spaces therebetween with the spaces being wider adjacent one of said rails than at the other of said rails;
    (b) preparing a longitudinal strip containing a plurality of substantially identical lead frame supports, each of said supports being formed from an electrically insulative, thermoplastic material and having a pad area at the center thereof, said pad area being square or rectangular, and having
        (i) first, raised, spaced-apart projections proximate the preriphery of said pad area, on all four sides thereof, the spaces between said first projections defining slots in which one end of said leads of said lead frame segments can be disposed, and
        (ii) second raised spaced-apart projections proximate the periphery of said support, the spaces between said second projections defining slots in which another end of said leads of said lead frame can be disposed;
    (c) severing a first lead frame segment, including its rails, from said strip thereof, and securing said first lead frame segment to a first support by positioning said leads of said lead frame segments in the spaces between said first and second raised projections and heating and slightly flowing said projections over said leads;
    (d) removing said rails;
    (e) repeating step (c) and step (d) until a lead frame segment has been secured to said support in each quadrant thereof;
    (f) disposing an IC chip in said pad area;
    (g) making electrical connections between said chip and said leads;
    (h) testing said electrical connections; and
    (j) subsequently disposing a cover on said support and sealing said cover to said support.

2. The method of making a lead frame support for an IC chip comprising the steps of:
    (a) preparing a longitudinal strip containing a plurality of substantially identical lead frame segments, each lead frame segment having a multiplicity of leads connected to opposing continuous rails, said leads having spaces therebetween with the spaces being wider adjacent one of said rails than at the other of said rails;

(b) preparing a longitudinal strip containing a plurality of substantially identical lead frame supports, each of said supports being formed from an electrically insulative, thermoplastic material and having a pad area at the center thereof, said pad area being square or rectangular, and having
  (i) first, raised, spaced-apart projections proximate the preriphery of said pad area, on all four sides thereof, the spaces between said first projections defining slots in which one end of said leads of said lead frame segments can be disposed, and
  (ii) second raised spaced-apart projections proximate the periphery of said support, the spaces between said second projections defining slots in which another end of said leads of said lead frame can be disposed;

(c) severing a first lead frame segment, including its rails, from said strip thereof, and securing said first lead frame segment to a first support by positioning said leads of said lead frame segments in the spaces between said first and second raised projections and heating and slightly flowing said projections over said leads;

(d) removing said rails;

(e) repeating step (c) and step (d) until a lead frame segment has ben secured to said support in each quadrant thereof.

* * * * *